US010560071B2

(12) United States Patent
Boulestin

(10) Patent No.: US 10,560,071 B2
(45) Date of Patent: Feb. 11, 2020

(54) RADIO FREQUENCY SIGNAL ATTENUATOR AND METHOD OF OPERATION THEREOF

(71) Applicant: STMicroelectronics SA, Montrouge (FR)

(72) Inventor: Renald Boulestin, Crolles (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 15/978,894

(22) Filed: May 14, 2018

(65) Prior Publication Data

US 2018/0331672 A1    Nov. 15, 2018

(30) Foreign Application Priority Data

May 15, 2017  (FR) ..................... 17 54242

(51) Int. Cl.
| | |
|---|---|
| *H03H 11/24* | (2006.01) |
| *H03F 3/19* | (2006.01) |
| *H04B 1/40* | (2015.01) |
| *H03G 3/30* | (2006.01) |

(52) U.S. Cl.
CPC ............. *H03H 11/245* (2013.01); *H03F 3/19* (2013.01); *H03G 3/3036* (2013.01); *H04B 1/40* (2013.01); *H03F 2200/451* (2013.01); *H03G 2201/307* (2013.01)

(58) Field of Classification Search
CPC ... H03H 11/245; H03F 3/19; H03F 2200/451; H03G 3/3036; H03G 2201/307; H04B 1/40
See application file for complete search history.

(56) References Cited

U.S. PATENT DOCUMENTS

| | | | |
|---|---|---|---|
| 2006/0238270 A1 | 10/2006 | Rostami et al. | |
| 2009/0284285 A1* | 11/2009 | Fagg | .................... H03H 19/004 327/91 |
| 2010/0310096 A1* | 12/2010 | Josefsson | ................. H04R 3/06 381/113 |
| 2014/0022019 A1 | 1/2014 | Trulls Fortuny et al. | |
| 2014/0266518 A1 | 9/2014 | Wang et al. | |

* cited by examiner

*Primary Examiner* — Nguyen T Vo
(74) *Attorney, Agent, or Firm* — Slater Matsil, LLP

(57) ABSTRACT

An embodiment attenuator includes a plurality of circuits coupled in series. A respective circuit includes a first capacitor connected between an input node of the respective circuit and an output node of the respective circuit, and a second capacitor connected between the output node of the respective circuit and a reference node. The output node of the respective circuit, other than a last circuit of the plurality of circuits, is connected to the input node of a successive circuit. The attenuator further includes a plurality of selectors, in which the respective circuit is associated with a respective selector that is coupled between the output node of the respective circuit and an output node of the attenuator.

22 Claims, 2 Drawing Sheets

RADIO FREQUENCY SIGNAL ATTENUATOR AND METHOD OF OPERATION THEREOF

CROSS-REFERENCE TO RELATED APPLICATIONS

This application claims priority to French Application No. 1754242, filed on May 15, 2017, which application is hereby incorporated herein by reference.

TECHNICAL FIELD

The present application relates generally to signal attenuation, and in particular embodiments, to a radio frequency signal attenuator and a method of operation thereof.

BACKGROUND

In numerous applications, and in particular in devices for receiving or transmitting a radio frequency signal, it is necessary to attenuate the signal using a controlled variable attenuator.

It may be desirable to obtain a purely capacitive controlled variable attenuator which is easy to produce and whose input impedance is constant.

SUMMARY

Thus, one embodiment provides a radio frequency signal attenuator including a plurality of successive units each one of which includes a first capacitor, connected between an input node of the unit and an output node of the unit, and a second capacitor, connected between the said output node and a reference node, the output node of each unit other than the last unit being connected to the input node of the following unit, the attenuator including a selector for selection of one of the output nodes of the units.

According to one embodiment, the selector includes, for each unit, a switch connected between the output node of the unit and the output of the attenuator.

According to one embodiment, a third capacitor is connected between the output node of the last unit and the reference node of the attenuator.

According to one embodiment, each second capacitor has a first capacitance value, the third capacitor has the first value and each first capacitor has a second capacitance value equal to twice the first value.

According to one embodiment, the capacitors are produced from unit capacitors all having the same capacitance value.

According to one embodiment, the attenuator is adapted to receive a radio frequency signal to be attenuated at the input node of the first unit.

Another embodiment provides a device for transmitting or receiving a radio frequency signal including an attenuator according to one of the above embodiments.

According to one embodiment, the input of the attenuator is coupled to an antenna and the output of the attenuator is coupled to the input of an analog-to-digital converter.

BRIEF DESCRIPTION OF THE DRAWINGS

These features and advantages, as well as others, will be described in detail in the following description of particular embodiments given in a non-limiting manner and with reference to the appended drawings in which.

DETAILED DESCRIPTION OF ILLUSTRATIVE EMBODIMENTS

The same elements have been denoted by the same references in the different figures. For purposes of clarity, only those elements useful for the understanding of the described embodiments have been shown and are described in detail.

In the following description, unless otherwise stated, the term "substantially" signifies "to within 10%" and preferably "to within 5%". Moreover, two elements are said to be connected when they are directly connected to each other, without the interposition of another element such as a circuit, a resistor, a coil, etc., and are said to be coupled when they are connected with or without the interposition of at least one other element.

Figure 1:
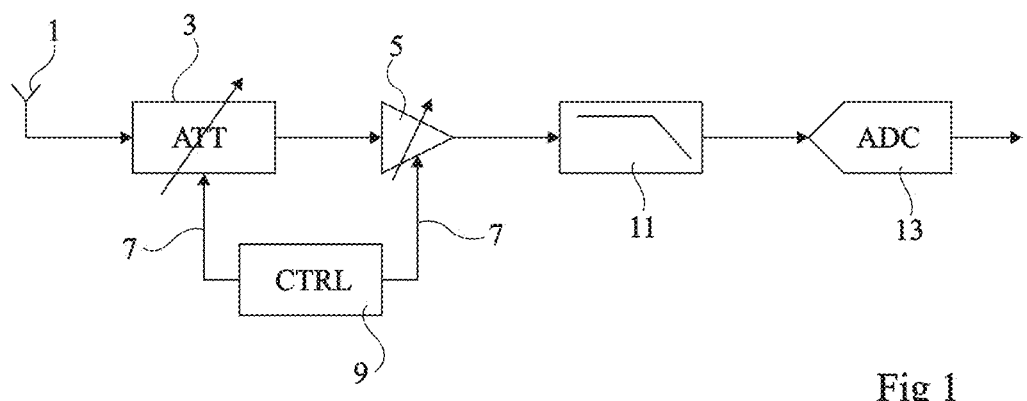
FIG. 1 is a block diagram of an example of a device for receiving a radio frequency signal.

FIG. 1 shows a simplified block diagram of an example of a device for receiving a radio frequency signal, that is to say a signal of frequency included, for example, between 300 kHz and 300 GHz, for example 13.56 MHz for near field communication (NFC) applications. The radio frequency signal is received by an antenna 1 and is transmitted to the input of a variable attenuator 3 (ATT). Although it is not shown in FIG. 1, intermediate circuits can be provided between the antenna 1 and the attenuator 3, for example, link capacitors for eliminating the DC component of the signal received by the antenna 1. The radio frequency signal at the output of the attenuator 3 is transmitted to the input of a variable gain amplifier 5. The value of the attenuation of the attenuator 3 and that of the gain of the amplifier 5 are selected from several possible values by digital control signals 7 provided by a control circuit (CTRL) 9. The radio frequency signal at the output of the amplifier 5 is transmitted to the input of a low-pass filter ii whose output is coupled to the input of an analog-to-digital converter (ADC) 13.

In the device shown in FIG. 1, in order for the conversion of the analog signal into a digital signal by the ADC 13 to be as efficient as possible, it is desirable for the maximum excursion of the signal at the input of the ADC 13 to be as close as possible to the maximum excursion accepted by the ADC 13 (or input dynamic range of the ADC 13), notably in order to obtain a signal-to-noise ratio (SNR) that is as high as possible. It is also desirable for the maximum excursion of the input signal of the ADC 13 to remain less than the input dynamic range of the ADC 13 in order not to clip the signal during its conversion. Thus, if the excursion of the radio frequency signal provided by the antenna 1 is too small, this signal is amplified by the amplifier 5, with the attenuator 3 being controlled so that its attenuation is as low as possible. Conversely, if the excursion of the signal provided by the antenna 1 is too large, this signal is attenuated by the attenuator 3, with the amplifier 5 being controlled so that its gain is as low as possible.

Figure 2:
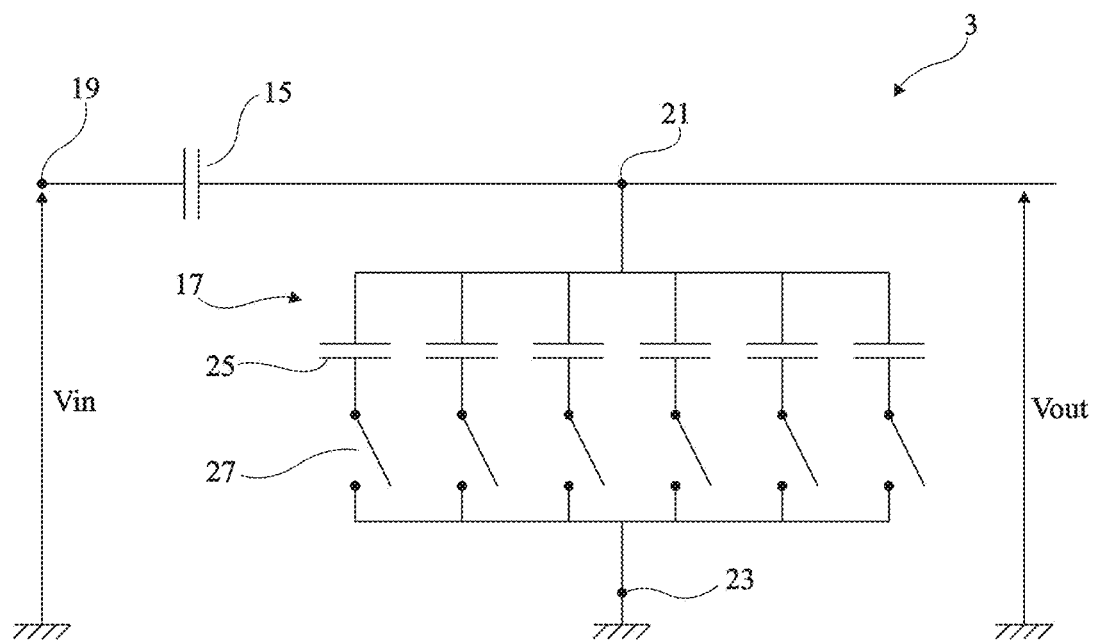
FIG. 2 is a circuit diagram of a radio frequency attenuator of the device shown in FIG. 1.

FIG. 2 shows an example of a circuit of a controlled variable attenuator 3. The attenuator 3 includes a capacitive divider bridge, which includes a capacitor 15 and a capacitive element 17, which may be of the DTC (Digitally Tunable Capacitor) type. One terminal of the capacitor 15 is connected to an input node 19 of the attenuator 3, the other terminal of the capacitor 15 being connected to an output node 21 of the attenuator 3. The capacitor 15 is, for example, a link capacitor. One terminal of the capacitive element 17 is connected to the output node 21, the other terminal of the element 17 being connected to a node 23 set at a reference potential, for example earth. The capacitive element 17 includes several branches in parallel between the nodes 21 and 23, six in the example shown in FIG. 2. Each branch includes a capacitor 25 in series with a switch 27, which may be implemented, for example, by one or two MOS transistors. The attenuator 3 makes it possible to have the availability of several attenuation values, each one of which corresponds to a given combination of on or off states of the switches 27.

During operation, a radio frequency signal to be attenuated Vin is applied to the node 19. An attenuation value is selected from among the possible values by controlling the on or off state of each switch 27. An attenuated signal Vout is then available at the node 21.

In the attenuator 3 shown in FIG. 2, the impedance seen by the signal Vin depends on the capacitance of the capacitive element 17, that it to say the chosen attenuation. These variations of input impedance of the attenuator 3 result in a poor input impedance matching of the attenuator, from which results a noisier signal supplied to the attenuator and/or a reduction of the maximum excursion of that signal.

Moreover, when each switch 27 is implemented by one or two MOS transistors, there is a parasitic capacitance between the terminals of the switch resulting from the parasitic drain/source capacitances of the MOS transistors. When the switch 27 is off, this parasitic capacitance is generally negligible in comparison with the capacitance of the capacitor 25 with which it is in series. On the other hand, this is not the case when the switch 27 is on. Thus, the capacitance of the capacitive element 17 is modified by the parasitic capacitances of the MOS transistors and by the on or off state of the latter, the result of which is that it is difficult to design an attenuator 3 providing attenuation values in regular steps, and to achieve the input impedance matching of the attenuator 3. Moreover, when the transistor or transistors of a switch 27 are in the on state, they introduce a corresponding resistance Ron in series with the capacitive element 17 which degrades the quality factor of the attenuator and modifies the values of the input impedance and attenuation of the attenuator.

Figure 3:
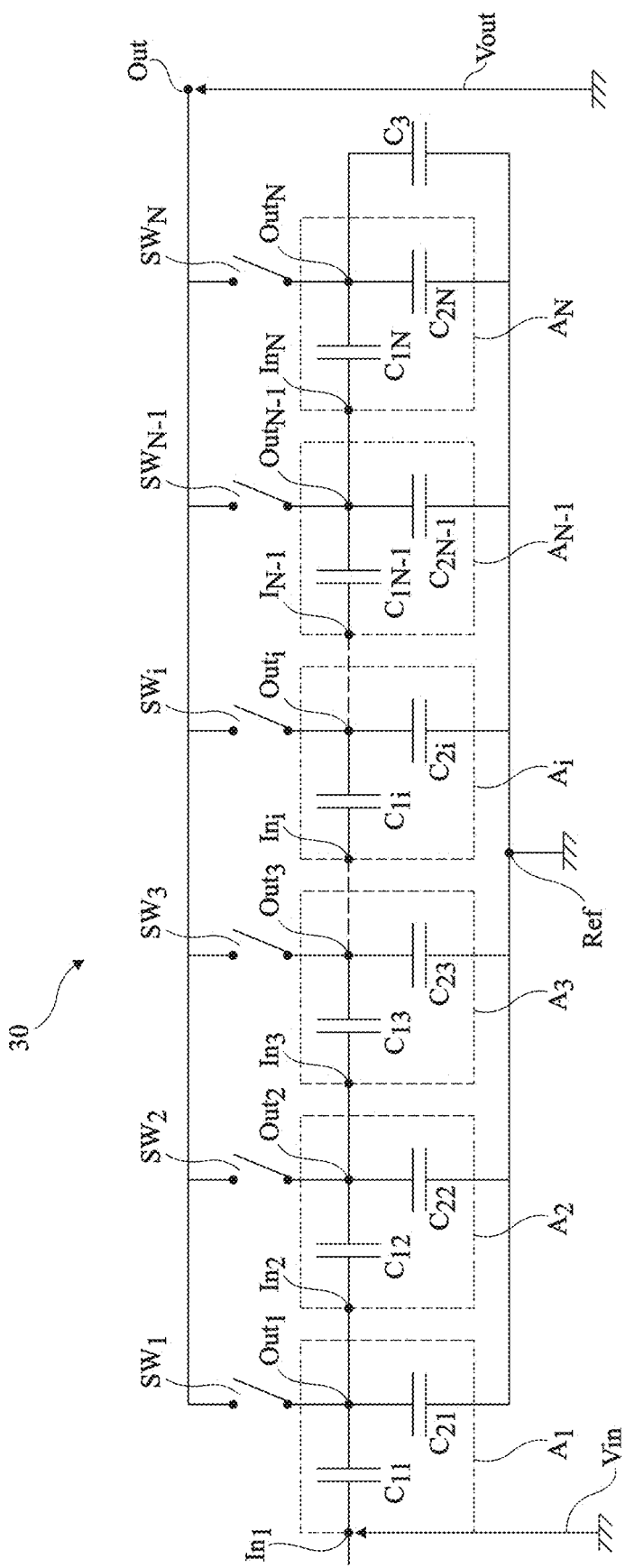
FIG. 3 is a circuit diagram of an embodiment of a controlled variable attenuation radio frequency attenuator that may be used in place of the circuit shown in FIG. 2.

FIG. 3 shows an embodiment of a controlled variable attenuation radio frequency attenuator 30 overcoming at least some of the disadvantages of the attenuator 3 shown in FIG. 2.

The attenuator 30 includes N successive units Ai, where i is an integer varying from 1 to N, and N is an integer greater than or equal to 2. As will be seen in more detail below, an attenuator 30 having N units makes it possible to obtain N different values of attenuation. Each unit Ai includes a first capacitor C1$i$, connected between an input node Ini of the unit and an output node Outi of the unit, and by a second capacitor C2$i$ connected between the node Outi and a reference node Ref. The output node Outi of each unit Ai (with the exception of the last unit AN) is connected to the input node Ini+1 of the following unit Ai+1.

In one example of embodiment, a capacitor C3 is connected between the output node OutN of the last unit AN and the node Ref.

During operation, the reference node Ref is set at a reference potential, for example the earth potential. The same bias potential can be applied to each of the nodes Outi, for example when the attenuator 30 is connected after a link capacitor. By way of example, a potential Vdd/2, where Vdd is the high power supply potential of the attenuator, is applied to each node Outi. A radio frequency signal to be attenuated Vin is applied to the input node Ini of the first unit A1 and attenuated signals are then available at each of the nodes Outi. The higher the index i of the output node Outi is, that is to say the further the unit Ai is away from the first unit A1 and the closer it is to the last unit AN, the more the signal provided by this node is attenuated with respect to the signal Vin. As a function of the attenuation value chosen from among the N available values, a selector is controlled in order to select the corresponding node Outi.

In the embodiment shown, the selector includes switches SWi. Each switch SWi is connected between the node Outi of a corresponding unit Ai and an output node or terminal Out of the attenuator 30. The selection of a node Outi therefore includes closing the corresponding switch SWi, and of opening all of the other switches. An output signal Vout corresponding to the signal Vin attenuated by a selected value is therefore available at the node Out. By way of example, each switch SWi corresponds to one or two MOS transistors whose gates receive a digital control signal. For example, each switch SWi corresponds to an N-channel MOS transistor and a P-channel MOS transistor connected in parallel between the node Out and the corresponding node Outi.

The N possible values of attenuation of the attenuator 30 depend on the capacitance of each capacitor C1$i$, C2$i$ and C3. Each capacitor C1$i$ or C2$i$ of a given unit Ai can have a capacitance different from those of the capacitors of the other units. Those skilled in the art will be able to calculate the value of each capacitor C1$i$, C2$i$ and C3 as a function of the N values of attenuation that they wish to have available. The configuration of the attenuator 30 means that the capacitance of each capacitor C1$i$, C2$i$ and C3 can be calculated easily, for example with the help of an edited spreadsheet in the software denoted by the name Excel.

Preferably, the values of the capacitors C1$i$, C2$i$ and C3 are chosen such that the attenuation of the signal available at the node Outi of a unit Ai with respect to the signal applied to the node Ini of that unit Ai is substantially constant whichever unit Ai is considered. By way of example, in the case where, for each unit Ai, a signal is attenuated by 6 dB between the node Ini and the node Outi of the unit, each capacitor C2$i$ has a capacitance C, for example 1 F, each capacitor C1$i$ has a capacitance 2*C, and the capacitor C3 a capacitance C. The signal available at a node Outi then corresponds to the signal Vin attenuated by i*6 dB. The configuration of the above example is particularly advantageous because it makes it possible to obtain, between each node Outi and the node Ref, the same capacitance of value 2*C. This configuration is particularly simple to use.

Advantageously, the input impedance of the attenuator 30 is substantially constant whatever node Outi is selected. This results from the fact that, whatever node Outi is selected, all of the capacitors C1$i$, C2$i$ and C3 are coupled to the input node Ini of the attenuator contrary to the case of the attenuator shown in FIG. 2 where, according to the selected attenuation, some of the capacitors 25 are not coupled to the input node 19 of the attenuator. For example, the input impedance of the attenuator is substantially constant when the capacitance of the load connected to the output of the attenuator 30 is negligible in comparison with the capacitance of each of the capacitors C1$i$, C2$i$ and C3, for example when the capacitance of the load is at least 10 times lower than the lowest capacitance of those capacitors.

Unlike the attenuator 3 shown in FIG. 2, no capacitor of the attenuator 30 is in series with one or more transistors. This makes it possible to be free from the effect of the parasitic capacitances and of the resistance Ron of these transistors on the attenuation values and on the value of the input impedance of the attenuator.

Because the units Ai of the attenuator 30 include only capacitive elements and no resistive element, the attenuator introduces only a very small amount of thermal noise and does not consume direct current (or DC). Thus, the attenuator 30 is particularly suitable for low consumption communication applications, for example near field communication or Bluetooth low energy.

Each of the capacitors $C1i$, $C2i$ and $C3$ is for example produced from a unit capacitor or from several unit capacitors connected in parallel and/or in series, all of the unit capacitors having the same capacitance. This makes it possible to simplify the design and the manufacture of an integrated circuit chip including the attenuator 30, notably by arranging the capacitors as a matrix. This also makes it possible to reduce the dispersions of the capacitances of the capacitors $C1i$, $C2i$ and $C3$ in comparison with the case where each of these capacitors would correspond to a single capacitor having the desired capacitance. By way of example, in the case where it is desired to obtain the attenuation values $-2, -4, -6, -8, -10, -12, -14$ and $-16$ dB, an attenuator 30 is provided having 8 units Ai, for example without a capacitor C3. The capacitors then have the following values: $C18=3.86*C$, $C28=C$, $C17=7*C$, $C27=C$, $C16=9*C$, $C26=C$, $C15=12*C$, $C25=C$, $C14=1.3*C$, $C24=C$, $C13=1.4*C$, $C23=C$, $C12=15*C$, $C22=C$, $C1i=15*C$ and $C21=C$, where C equals 200 fF for example. In this case, the various capacitors $C1i$, $C2i$ can be produced from a matrix of unit capacitors each having a capacitance C.

Particular embodiments have been described. Various variants and modifications will be apparent to those skilled in the art. In particular, the attenuator 30 can be used instead and in place of the attenuator 3 shown in FIG. 1. The selector for selection of one or other of the nodes Outi is therefore controlled by the signals 7 from the control circuit CTRL 9. More generally, the attenuator 30 can be used in any device for radio frequency transmitting or receiving and in any radio frequency device where a radio frequency signal is attenuated by a value selected by control signals from among several possible values.

Moreover, in the case of a radio frequency signal receiver designed for processing a differential radio frequency signal measured between two nodes having equal and opposite voltage excursions with respect to a fixed potential commonly called common mode, one of these two nodes is coupled to the input of a first attenuator 30 and the other one of these two nodes is coupled to the input of a second attenuator 30. In this case, the common mode potential can be applied to each node Outi of the first and second attenuators 30 of the radio frequency signal receiver.

Even though it has not been mentioned above, an attenuator 30 of the type of the one shown in FIG. 3 can be entirely produced in the form of an integrated circuit, for example on silicon. More generally, a radio frequency signal receiver, for example of the type of the one shown in FIG. 1, or a radio frequency signal transmitter including at least one attenuator 30 can be produced in the form of an integrated circuit.

What is claimed is:

1. An attenuator, comprising:
a plurality of capacitors including a plurality of circuits coupled in series, wherein a respective circuit comprises:
a first capacitor connected between an input node of the respective circuit and an output node of the respective circuit, and
a second capacitor connected between the output node of the respective circuit and a reference node, wherein the output node of the respective circuit, other than a last circuit of the plurality of circuits, is connected to the input node of a successive circuit, and
a third capacitor directly connected between the output node of the last circuit and the reference node; and
a plurality of selectors, wherein the respective circuit is associated with a respective selector, wherein the respective selector is coupled between the output node of the respective circuit and an output node of the attenuator, wherein attenuation values of the attenuator depend only on the capacitance values of the plurality of capacitors.

2. The attenuator according to claim 1, wherein an input node of a first one of the plurality of circuits comprises an input node of the attenuator.

3. The attenuator according to claim 1, wherein the respective selector comprises a switch connected between the output node of the respective circuit and the output node of the attenuator.

4. The attenuator according to claim 1, wherein the second capacitor has a first capacitance value, the third capacitor has the first capacitance value, and the first capacitor has a second capacitance value equal to twice the first capacitance value.

5. The attenuator according to claim 1, wherein the first capacitor and the second capacitor are produced from unit capacitors having equal capacitance values.

6. The attenuator according to claim 1, wherein a capacitance of the first capacitor of a given circuit of the plurality of circuits is different from capacitances of the first capacitor and the second capacitor of all other circuits of the plurality of circuits, and wherein a capacitance of the second capacitor of the given circuit of the plurality of circuits is different from the capacitances of the first capacitor and the second capacitor of all other circuits of the plurality of circuits.

7. The attenuator according to claim 1, wherein each of the plurality of capacitors comprises a unit capacitor or several unit capacitors connected together, all of the unit capacitors having the same capacitance.

8. A device for transmitting or receiving a radio frequency signal, the device comprising:
an antenna configured to receive an analog signal;
a controllable attenuator having variable attenuation values, the controllable attenuator comprising an input node coupled to an output of the antenna, the controllable attenuator comprising:
a plurality of capacitors comprising a plurality of circuits coupled in series, wherein a respective circuit comprises:
a first capacitor connected between an input node of the respective circuit and an output node of the respective circuit,
a second capacitor connected between the output node of the respective circuit and a reference node, wherein the output node of the respective circuit, other than a last circuit of the plurality of circuits, is connected to the input node of a successive circuit, and a third capacitor directly connected between the output node of the last circuit and the reference node; and a plurality of selectors, wherein the respective circuit is associated with a respective selector, wherein the respective selector is coupled between the output node of the respective circuit and an output node of the controllable attenuator; and a control circuit configured to provide a control signal to the controllable attenuator, wherein the control signal is configured to modulate a selection of the plurality of selectors to vary attenuation values of the controllable attenuator, wherein the attenuation values of the attenuator depend only on the capacitance values of the plurality of capacitors.

9. The device according to claim 8, wherein an input node of a first one of the plurality of circuits comprises an input node of the controllable attenuator.

10. The device according to claim 8, wherein the respective selector comprises a switch configured to be controlled by the control signal, the switch being connected between the output node of the respective circuit and the output node of the controllable attenuator.

11. The device according to claim 10, wherein the switch comprises a metal-oxide-semiconductor transistor having a control terminal coupled to the control circuit.

12. The device according to claim 8, wherein the second capacitor has a first capacitance value, the third capacitor has the first capacitance value, and the first capacitor has a second capacitance value equal to twice the first capacitance value.

13. The device according to claim 8, wherein the first capacitor and the second capacitor are produced from unit capacitors having equal capacitance values.

14. The device according to claim 8, wherein the reference node is coupled to a ground potential.

15. The device according to claim 8, wherein output nodes of the plurality of circuits are coupled to an identical bias potential.

16. The device according to claim 8, further comprising:
a variable gain amplifier having an input coupled to the output node of the controllable attenuator, wherein the control circuit is configured to vary a gain of the variable gain amplifier;
a low-pass filter having an input coupled to an output of the variable gain amplifier; and
an analog-to-digital convertor having an input coupled to an output of the low-pass filter.

17. The device according to claim 8, wherein a capacitance of the first capacitor of a given circuit of the plurality of circuits is different from capacitances of the first capacitor and the second capacitor of all other circuits of the plurality of circuits, and wherein a capacitance of the second capacitor of the given circuit of the plurality of circuits is different from the capacitances of the first capacitor and the second capacitor of all other circuits of the plurality of circuits.

18. The device according to claim 8, wherein the impedance of the attenuator is substantially constant and is independent of the selection of the plurality of selectors.

19. A method, comprising:
receiving an analog signal at an input terminal of a variable attenuator; and
generating a control signal configured to modulate an attenuation of the variable attenuator, the variable attenuator comprising:
a plurality of capacitors comprising plurality of circuits coupled in series, wherein a respective circuit comprises:
a first capacitor connected between an input node of the respective circuit and an output node of the respective circuit,
a second capacitor connected between the output node of the respective circuit and a reference node, wherein the output node of the respective circuit, other than a last circuit of the plurality of circuits, is connected to the input node of a successive circuit, and
a third capacitor directly connected between the output node of the last circuit and the reference node; and
a plurality of switches configured to receive the control signal, wherein the respective circuit is associated with a respective switch, wherein the respective switch is coupled between the output node of the respective circuit and an output node of the variable attenuator, wherein a capacitance of the first capacitor of a given circuit of the plurality of circuits is different from capacitances of the first capacitor and the second capacitor of all other circuits of the plurality of circuits, and wherein a capacitance of the second capacitor of the given circuit of the plurality of circuits is different from the capacitances of the first capacitor and the second capacitor of all other circuits of the plurality of circuits, wherein attenuation values of the attenuator depend only on the capacitance values of the plurality of capacitors.

20. The method according to claim 19, wherein the second capacitor has a first capacitance value, and the first capacitor has a second capacitance value equal to twice the first capacitance value.

21. The method according to claim 19, wherein the reference node is coupled to a ground potential.

22. The method according to claim 19, wherein the impedance of the attenuator is substantially constant and is independent of the selection of the plurality of switch.

* * * * *